(12) United States Patent
Huang et al.

(10) Patent No.: US 9,035,195 B2
(45) Date of Patent: May 19, 2015

(54) CIRCUIT BOARD HAVING TIE BAR BURIED THEREIN AND METHOD OF FABRICATING THE SAME

(71) Applicants: Hsin-Mao Huang, Changhua County (TW); Chun-Huang Yu, Changhua County (TW)

(72) Inventors: Hsin-Mao Huang, Changhua County (TW); Chun-Huang Yu, Changhua County (TW)

(73) Assignee: NANYA TECHNOLOGY CORPORATION, Taouan (TW)

( * ) Notice: Subject to any disclaimer, the term of this patent is extended or adjusted under 35 U.S.C. 154(b) by 199 days.

(21) Appl. No.: 13/674,919

(22) Filed: Nov. 12, 2012

(65) Prior Publication Data

US 2014/0131085 A1 May 15, 2014

(51) Int. Cl.
*H05K 1/11* (2006.01)
*H05K 3/24* (2006.01)
*H05K 1/02* (2006.01)

(52) U.S. Cl.
CPC .............. *H05K 3/242* (2013.01); *H05K 1/112* (2013.01); *H05K 1/0298* (2013.01); *H05K 1/113* (2013.01); *H05K 1/117* (2013.01); *H05K 3/244* (2013.01); *H05K 2201/0338* (2013.01); *H05K 2203/0228* (2013.01)

(58) Field of Classification Search
CPC ..... H05K 1/113; H05K 1/111; H05K 3/4038; H05K 3/10; H05K 1/11; H05K 1/112; H05K 1/114; H05K 1/115; H05K 1/0222; H05K 1/144; H05K 3/243; H05K 3/242; H01L 21/486
See application file for complete search history.

(56) References Cited

U.S. PATENT DOCUMENTS

| | | | | |
|---|---|---|---|---|
| 4,081,601 | A  * | 3/1978  | Dinella et al. | 174/257 |
| 5,382,759 | A  * | 1/1995  | Kei Lau et al. | 174/264 |
| 6,023,211 | A  * | 2/2000  | Somei | 333/246 |
| 6,660,559 | B1 * | 12/2003 | Huemoeller et al. | 438/106 |
| 7,035,080 | B1 * | 4/2006  | Devoe et al. | 361/306.1 |
| 2002/0105083 | A1* | 8/2002  | Sun et al. | 257/758 |
| 2005/0037638 | A1* | 2/2005  | Huang et al. | 439/70 |
| 2008/0277145 | A1* | 11/2008 | Lin et al. | 174/254 |
| 2009/0144474 | A1* | 6/2009  | Zhang et al. | 710/301 |
| 2010/0255690 | A1* | 10/2010 | Waite et al. | 439/65 |

FOREIGN PATENT DOCUMENTS

CN 102427682 4/2012

OTHER PUBLICATIONS

English translation of XU CN102427682 published Apr. 25, 2012.*
"Office Action of Taiwan Counterpart Application", issued on Oct. 27, 2014, p. 1-p. 7, in which the listed reference was cited.

* cited by examiner

*Primary Examiner* — Tuan T Dinh
*Assistant Examiner* — Steven T Sawyer
(74) *Attorney, Agent, or Firm* — Jianq Chyun IP Office

(57) ABSTRACT

Provided is a circuit board having a tie bar buried therein. The circuit board includes a dielectric stack, at least a first tie bar, at least a first gold finger and at least a first microvia. The dielectric stack includes a first dielectric layer and a second dielectric layer. The first dielectric layer is located on the second dielectric layer. The dielectric stack includes a wireline region and a gold finger region. The first tie bar is buried in the gold finger region between the first dielectric layer and the second dielectric layer. The at least a first gold finger is located in the gold finger region on the first dielectric layer. The first microvia is located in the gold finger region in the first dielectric layer, and electrically connects the first gold finger to the first tie bar.

9 Claims, 7 Drawing Sheets

CIRCUIT BOARD HAVING TIE BAR BURIED THEREIN AND METHOD OF FABRICATING THE SAME

BACKGROUND OF THE INVENTION

1. Field of Invention

The present invention relates to a circuit board and a method of fabricating the same.

2. Description of Related Art

The main function of a circuit board is to provide connecting circuits between devices. In general, a circuit board is connected with a motherboard through a connector commonly called "gold finger."

In current memory module circuit board techniques, after obtaining a copper wire by etching, a gold plating process is usually necessary. Referring to FIG. 1, when gold plating is performed on a copper wire of a gold finger body 106 in a gold finger region, a particularly reserved tie bar 108 is the only way to connect to a current from a cathode rod outside the circuit board. In a board cutting process for forming a circuit board following gold plating, the circuit board is cut along a board edge and a gold finger 104 as shown in FIG. 1 is formed. In other words, the gold finger 104 is usually composed of the gold finger body 106 and a tie bar 108 directly electrically connected to the gold finger body 106.

However, as a board cutting process is normally performed by a cutting tool such as a sawing knife during a fabrication process of or a test period for a circuit board, the tie bar 108 could be easily broken or peeled off due to plugging and unplugging. Such defect may also occur when a circuit board is installed afterwards. In addition, with downsizing of devices, size of a tie bar may be limited due to reduction in size of a gold finger. Furthermore, there may be short circuit conditions between a tie bar and a pin, resulting in scrap of an entire device.

SUMMARY OF THE INVENTION

The present invention provides a circuit board and a method of fabricating the same, wherein area of a tie bar is not limited due to reduction in size of a gold finger. Moreover, after a board cutting process for fabricating the circuit board, or during a test period for the circuit board, the tie bar is not easily broken or peeled off due to plugging and unplugging.

The present invention proposes a circuit board having a tie bar buried therein. The circuit board includes a dielectric stack, at least a first tie bar, at least a first gold finger and at least a first microvia. The dielectric stack comprises a first dielectric layer and a second dielectric layer. The first dielectric layer is located on the second dielectric layer. The dielectric stack includes a wireline region and a gold finger region. The first tie bar is buried in the gold finger region between the first dielectric layer and the second dielectric layer. The at least a first gold finger is located in the gold finger region on the first dielectric layer on the first tie bar. The first microvia is located in the gold finger region in the first dielectric layer, and electrically connects the first gold finger to the first tie bar.

According to an embodiment of the present invention, a portion of the first tie bar is not covered by the first gold finger.

According to an embodiment of the present invention, the circuit board having a tie bar buried therein further includes at least a patterned conductive layer and at least a second microvia. The patterned conductive layer is located on the first dielectric layer. The second microvia is located in the first dielectric layer and electrically connects the patterned conductive layer to the first tie bar.

According to an embodiment of the present invention, the circuit board having a tie bar buried therein further includes a first connecting wire, which is located on the first dielectric layer and is electrically connected to the patterned conductive layer.

According to an embodiment of the present invention, the dielectric stack of the circuit board having a second tie bar buried therein includes a third dielectric layer and a fourth dielectric layer. The circuit board further includes at least a second tie bar, at least a second gold finger, and at least a third microvia. The second tie bar is buried in the gold finger region between the third dielectric layer and the fourth dielectric layer. The second gold finger is located in the gold finger region on the fourth dielectric layer on the second tie bar. The third microvia is located in the gold finger region in the fourth dielectric layer and electrically connects the second gold finger to the second tie bar.

According to an embodiment of the present invention, at least a second patterned conductive layer located on the fourth dielectric layer and at least a fourth microvia located in the fourth dielectric layer and electrically connecting the second patterned conductive layer to the second tie bar.

According to an embodiment of the present invention, the circuit board having a tie bar buried therein further includes a second connecting wire located on the fourth dielectric layer and electrically connected to the second patterned conductive layer.

The present invention also proposes a method of fabricating a circuit board having a tie bar buried therein. A dielectric stack is provided. The dielectric stack includes a wireline region and a gold finger region. The dielectric stack includes a first dielectric layer and a second dielectric layer. A plurality of wireline layers are formed in the wireline region in the dielectric stack. At least a first tie bar is formed in the gold finger region between the first dielectric layer and the second dielectric layer. At least a first gold finger is formed in the gold finger region on the first dielectric layer. At least a first microvia is formed in the first dielectric layer. The first microvia electrically connects the first gold finger to the first tie bar.

According to an embodiment of the present invention, methods of forming the first gold finger and the first microvia include the following steps. A first layer of the first gold finger is formed in the gold finger region on the first dielectric layer. At least a first microvia hole is formed in the gold finger region in the first dielectric layer. The first microvia is formed in the first microvia hole. A second layer is formed on the first layer of the first gold finger.

According to an embodiment of the present invention, the method of fabricating a circuit board having a tie bar buried therein further includes following steps. At least a first patterned conductive layer is formed on the first dielectric layer. At least a second microvia is formed in the first dielectric layer. The second microvia electrically connects the first patterned conductive layer to the first tie bar.

According to an embodiment of the present invention, the method of fabricating a circuit board having a tie bar buried therein further includes forming a first connecting wire, which is electrically connected to the first patterned conductive layer.

According to an embodiment of the present invention, the method of fabricating a circuit board having a tie bar buried therein further includes performing a board cutting process to cut the first patterned conductive layer, and a portion of the dielectric stack and a portion of the first tie bar under the first patterned conductive layer.

According to an embodiment of the present invention, the dielectric stack includes a third dielectric layer and a fourth dielectric layer. The method of fabricating a circuit board having a tie bar buried therein further includes the following steps. At least a second tie bar is formed in the gold finger region between the third dielectric layer and the fourth dielectric layer. At least a second gold finger and at least a third microvia are formed on and in the gold finger region on the fourth dielectric layer. The third microvia electrically connects the second gold finger to the second tie bar.

According to an embodiment of the present invention, the method of fabricating a circuit board further includes forming at least a second patterned conductive layer on the fourth dielectric layer and forming at least a fourth microvia in the fourth dielectric layer, the fourth microvia electrically connecting the second patterned conductive layer to the second tie bar.

According to an embodiment of the present invention, the method of fabricating a circuit board further includes forming a second connecting wire, electrically connected to the second patterned conductive layer.

According to an embodiment of the present invention, the method of fabricating a circuit board further includes performing a board cutting process to cut the second patterned conductive layer, and a portion of the dielectric stack and a portion of the second tie bar under the second patterned conductive layer.

Based on the above, in the circuit board of the present invention and the method of fabricating the same, a tie bar and a gold finger are disposed at different levels. The tie bar is buried in a dielectric layer and is electrically connected to the gold finger via a microvia. Therefore, area of the tie bar is not limited due to reduction in size of the gold finger. Moreover, since the tie bar is covered by a dielectric stack, after a board cutting process or during a test period, the tie bar is not easily broken or peeled off due to plugging and unplugging.

In order to make the aforementioned and other objects, features and advantages of the present invention comprehensible, a preferred embodiment accompanied with figures is described in detail below.

DESCRIPTION OF EMBODIMENTS

The present invention proposes a circuit board having a tie bar buried therein. A tie bar is at a different level from a gold finger. The gold finger is located on a dielectric stack, while the tie bar is buried in the dielectric stack under the gold finger.

Figure 1:
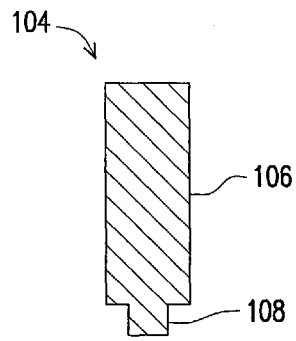
FIG. 1 illustrates a top view of a conventional gold finger.
Figure 2A:
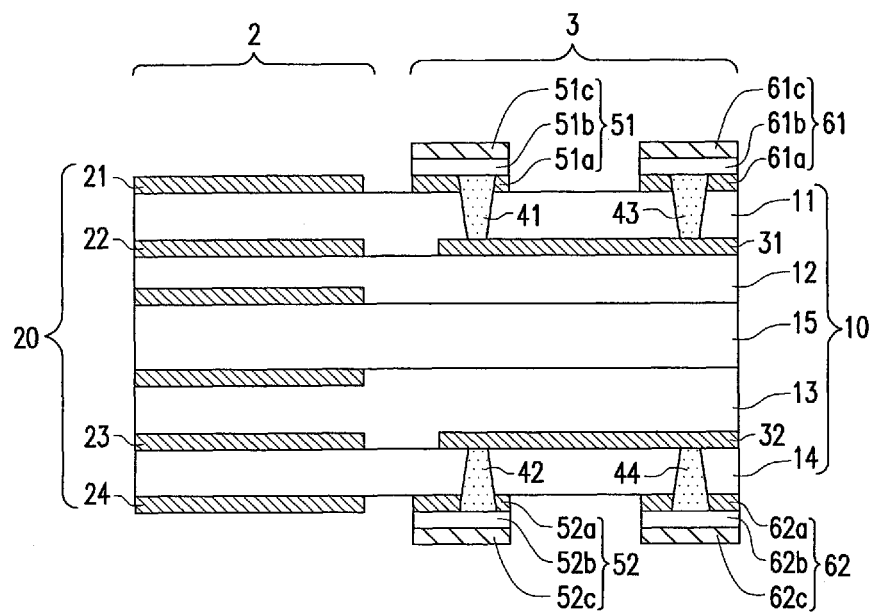
FIG. 2A illustrates a cross-sectional schematic view of a circuit board having a tie bar buried therein of an embodiment of the present invention before a board cutting process.
Figure 3A:
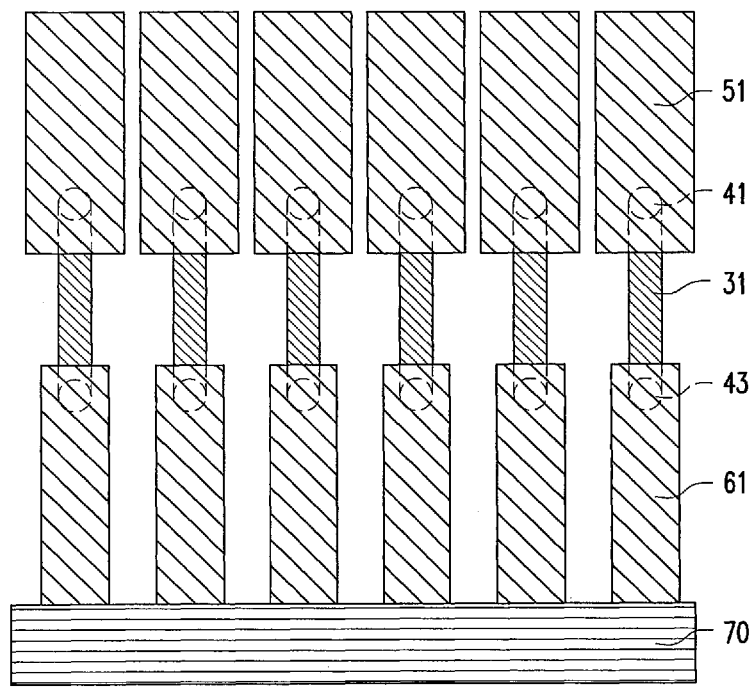
FIG. 3A illustrates a first top view of a circuit board having a tie bar buried therein of an embodiment of the present invention before a board cutting process.

FIG. 2A illustrates a cross-sectional schematic view of a circuit board having a tie bar buried therein of an embodiment of the present invention before a board cutting process. FIG. 3A illustrates a first top view of a circuit board having a tie bar buried therein of an embodiment of the present invention before a board cutting process. FIG. 3C illustrates a second top view of a circuit board having a tie bar buried therein of an embodiment of the present invention before a board cutting process.

Referring to FIG. 2A, FIG. 3A and FIG. 3C, a circuit board comprises a dielectric stack 10, wireline layers 20, a first tie bar 31, a second tie bar 32, a first microvia 41, a third microvia 42, a first gold finger 51 and a second gold finger 52.

The dielectric stack 10 comprises a first dielectric layer 11, a second dielectric layer 12, a third dielectric layer 13 and a fourth dielectric layer 14. The first dielectric layer 11 and the fourth dielectric layer 14 are the outermost dielectric layers. The second dielectric layer 12 and the third dielectric layer 13 are inner dielectric layers, tightly adjacent to the first dielectric layer 11 and the fourth dielectric layer 14, respectively. The second dielectric layer 12 and the third dielectric layer 13 comprise another dielectric layer 15 therebetween.

The dielectric stack 10 is divided into a wireline region 2 and a gold finger region 3. The wireline layers 20 are located in the dielectric stack 10 or on the dielectric stack 10. More specifically, the wireline layers 20 are located in the wireline region 2, and comprise a first wireline layer 21, a second wireline layer 22, a third wireline layer 23 and a fourth wireline layer 24. The first wireline layer 21 and the fourth wireline layer 24 are the outermost, and are located on the first dielectric layer 11 and the fourth dielectric layer 14, respectively. The second wireline layer 22 is located between the first dielectric layer 11 and the second dielectric layer 12. The third wireline layer 23 is located between the third dielectric layer 13 and the fourth dielectric layer 14. Another wireline layer is comprised in the another dielectric layer 15 between the second dielectric layer 12 and the third dielectric layer 13. The wireline layers 20 are made of conductors, including metals or alloys, such as copper or copper aluminium alloy. The wireline layers are electrically connected with one another via vias (not illustrated).

The first gold finger 51 is located in the gold finger region 3 on the first dielectric layer 11. The second gold finger 52 is located in the gold finger region 3 in the fourth dielectric layer 14. That is, the first gold finger 51 and the first wireline layer 21 are at the same level; the second gold finger 52 and the fourth wireline layer 24 are at the same level. The first gold finger 51 and the second gold finger 52 may be composed of a single layer material, or two or more layers of materials. In an embodiment, the first gold finger 51/the second gold finger 52 comprise first layers 51a/52a, second layers 51b/52b and third layers 51c/52c. The first layers 51a/52a are, for example, copper layers. The second layers 51b/52b are, for example, nickel layers. The third layers 51c/52c are, for example, gold layers.

The first tie bar 31 and the first gold finger 51 are not at the same level; the second tie bar 32 and the second gold finger 52 are not at the same level. Specifically, the first tie bar 31 is buried in the gold finger region 3 between the first dielectric layer 11 and the second dielectric layer 12. The second tie bar 32 is buried in the gold finger region 3 between the third dielectric layer 13 and the fourth dielectric layer 14. In other words, the first tie bar 31 and the second wireline layer 22 are at the same level; the second tie bar 32 and the third wireline layer 23 are at the same level. The materials of the first tie bar 31 and the second tie bar 32 may be the same as or different from those of, respectively, the second wireline layer 22 and the third wireline layer 23.

The first tie bar 31 is not completely covered by the first gold finger 51, and a portion of the first tie bar 31 is protruded from an area covered by the first gold finger 51. Similarly, the second tie bar 32 is not completely covered by the second gold finger 52, and a portion of the second tie bar 32 is protruded from an area covered by the second gold finger 52.

The first microvia 41 is located in the gold finger region 3 in the first dielectric layer 11 and is used to electrically connect the first gold finger 51 to the first tie bar 31. The third microvia 42 is located in the gold finger region 3 in the fourth dielectric layer 14, and is used to electrically connect the second gold finger 52 to the second tie bar 32.

Referring to FIG. 2A, FIG. 3A and FIG. 3C, before a board cutting process is performed, the first tie bar 31 and the second tie bar 32 are electrically connected to a first patterned conductive layer 61 on a surface of the first dielectric layer 11 and a second patterned conductive layer 62 on a surface of the fourth dielectric layer 14, respectively via a second microvia 43 in the first dielectric layer 11 and a fourth microvia 44 in the fourth dielectric layer 14. The first patterned conductive layer 61 and the second patterned conductive layer 62 are respectively electrically connected to a first connecting wire 70 and a second connecting wire 71. The first connecting wire 70 and the second connecting wire 71 are electrically connected to a cathode rod outside the board.

Figure 2B:
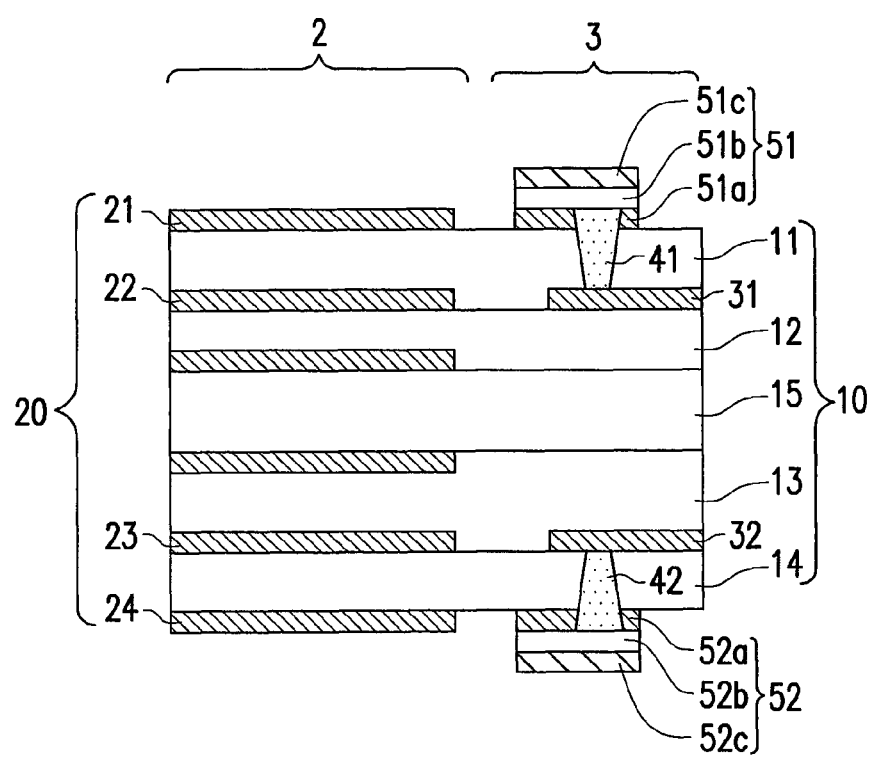
FIG. 2B illustrates a cross-sectional schematic view of a circuit board having a tie bar buried therein of an embodiment of the present invention after a board cutting process.
Figure 3B:
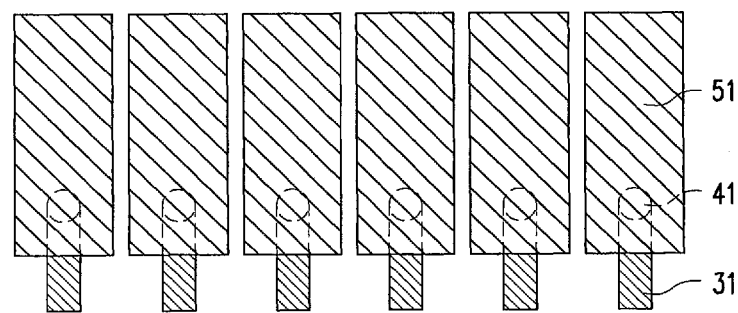
FIG. 3B illustrates a first top view of a circuit board having a tie bar buried therein of an embodiment of the present invention after a board cutting process.
Figure 3C:
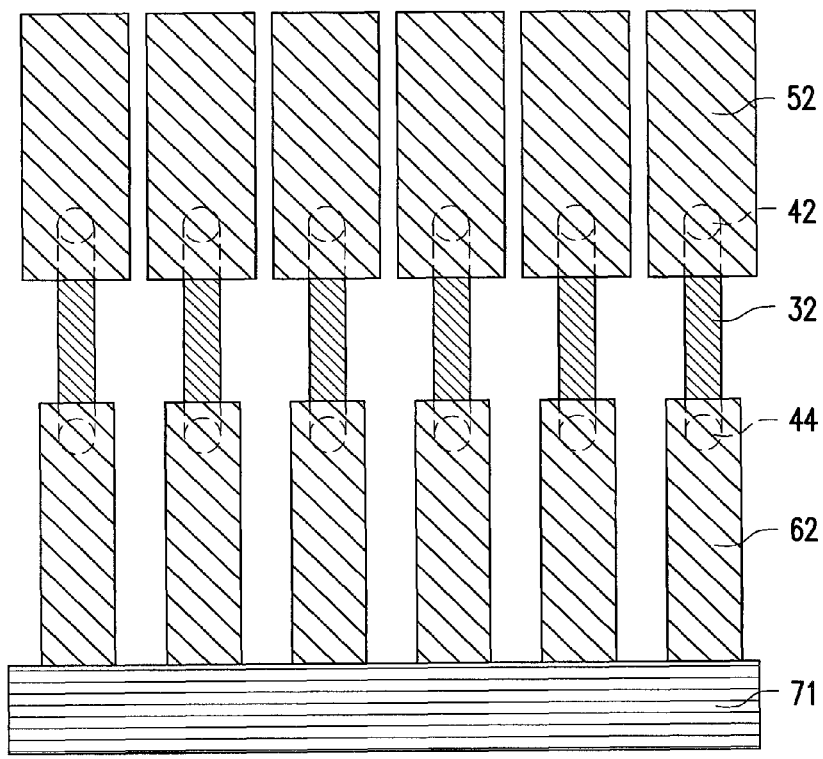
FIG. 3C illustrates a second top view of a circuit board having a tie bar buried therein of an embodiment of the present invention before a board cutting process.
Figure 3D:
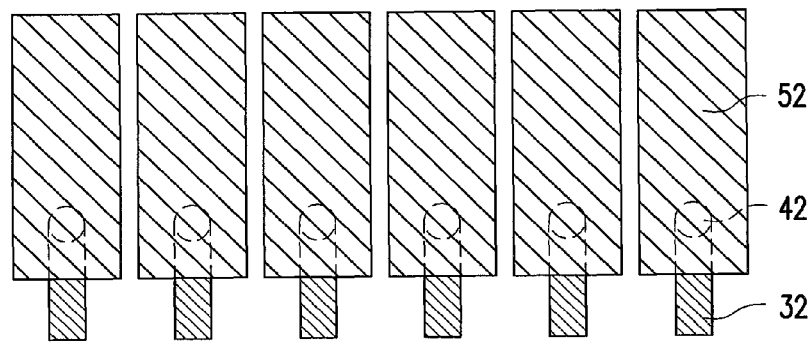
FIG. 3D illustrates a second top view of a circuit board having a tie bar buried therein of an embodiment of the present invention after a board cutting process.

After a board cutting process is performed, structures are as shown in FIGS. 2B, 3B and 3D.

FIG. 4A to FIG. 4E illustrate cross-sectional views of a fabrication process of a circuit board having a tie bar buried therein of an embodiment of the present invention.

Figure 4A:
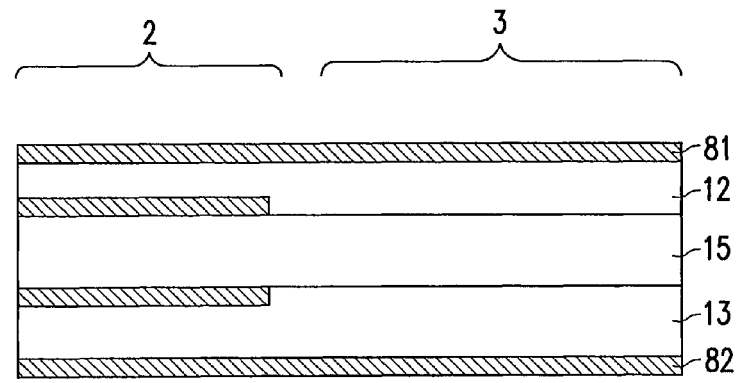
FIG. 4A to FIG. 4E illustrate cross-sectional views of a fabrication process of a circuit board having a tie bar buried therein of an embodiment of the present invention.

Referring to FIG. 4A, the method of fabricating the circuit board is first forming the second dielectric layer 12, the third dielectric layer 13 and the another dielectric layer 15, and after forming other wireline layers in the wireline region 2 in the above-mentioned dielectric layers 12, 13, 15. A first conductive material layer 81 and a second conductive material layer 82 are pressed, respectively on the second dielectric layer 12 and the third dielectric layer 13.

Figure 4B:
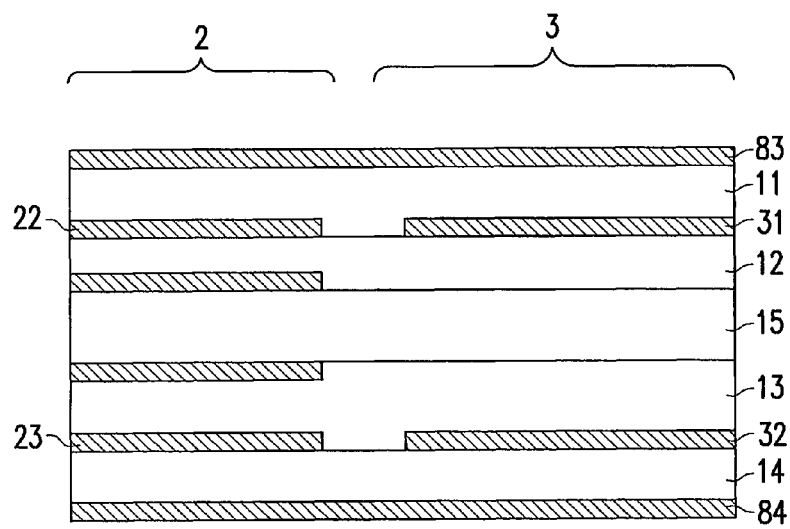

Then, referring to FIG. 4B, the first conductive material layer 81 is patterned by performing etching, so as to form the second wireline layer 22 in the wireline region 2, and to form the first tie bar 31 in the gold finger region 3. The second conductive material layer 82 is patterned to form the third wireline layer 23 in the wireline region 2 and to form the second tie bar 32 in the gold finger region 3.

After that, the first dielectric layer 11 and a third conductive material layer 83 are pressed on the second wireline layer 22 and the first tie bar 31. The fourth dielectric layer 14 and a fourth conductive material layer 84 are pressed on the third wireline layer 23 and the second tie bar 32. The third conductive material layer 83 and the fourth conductive material layer 84 are, for example, copper layers.

Figure 4C:
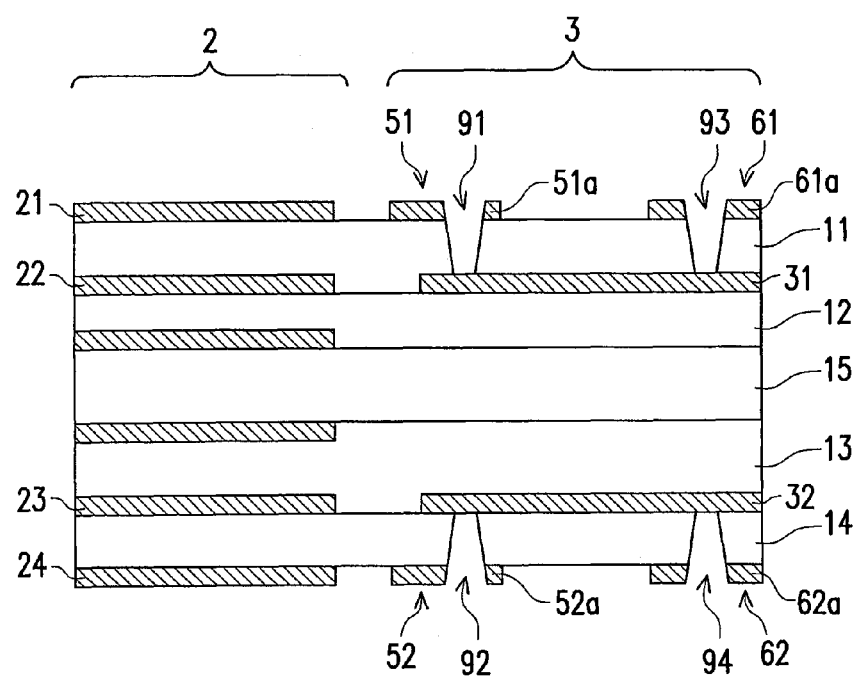

After that, referring to FIG. 4C, the third conductive material layer 83 is patterned by performing etching, so as to form the first wireline layer 21 in the wireline region 2 and to form a first layer 51a of the first gold finger 51, a first layer 61a of the first patterned conductive layer 61, and the first connecting wire 70 (FIG. 3A). The fourth conductive material layer 84 is patterned to form the fourth wireline layer 24 in the wireline region 2, and to form a first layer 52a of the second gold finger 52, a first layer 62a of the second patterned conductive layer 62, and a second connecting wire 71 (FIG. 3C) in the gold finger region 3.

After that, a portion of the first layer 51a of the first gold finger 51 and a portion of the first dielectric layer 11 are removed by performing a laser drilling, so as to form a first microvia hole 91 and expose the first tie bar 31. A portion of the first layer 52a of the second gold finger 52 and a portion of the fourth dielectric layer 14 are removed to form a third microvia hole 92 and expose the second tie bar 32. A portion of the first layer 61a of the first patterned conductive layer 61 and a portion of the first dielectric layer 11 are removed to form a second microvia hole 93 and expose the first tie bar 31. A portion of the first layer 62a of the second patterned conductive layer 62 and a portion of the fourth dielectric layer 14 are removed to form a fourth microvia hole 94 and expose the second tie bar 32.

Figure 4D:
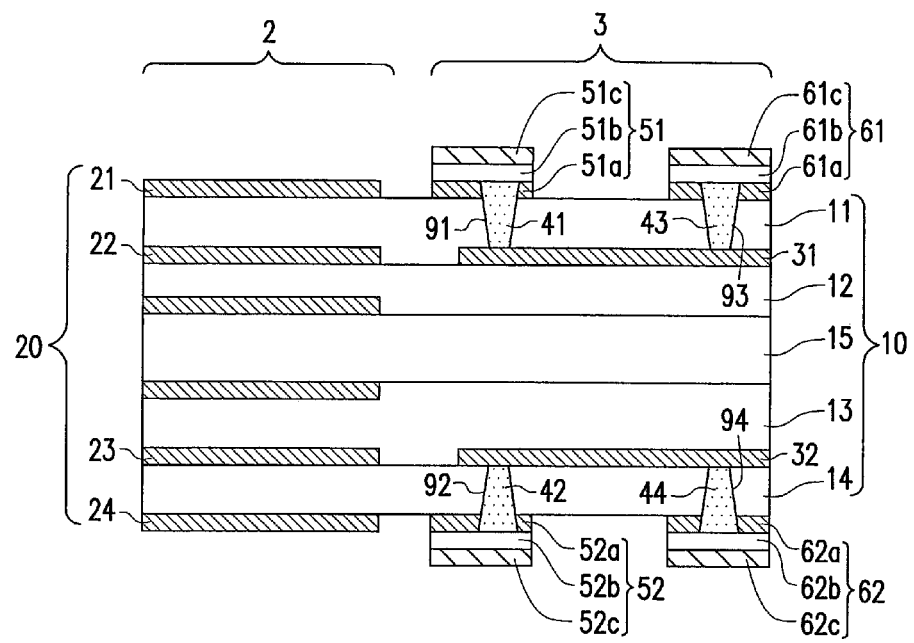

After that, referring to FIG. 4D, conductor materials are filled into the first microvia hole 91, the third microvia hole 92, the second microvia hole 93 and the fourth microvia hole 94, so as to form the first microvia 41, the third microvia 42, the second microvia 43 and the fourth microvia 44. A method of filling conductor materials into the first microvia hole 91 and the second microvia hole 93 is performed by electroplating. During the electroplating, the first patterned conductive layer 61 and the second patterned conductive layer 62 are electrically connected to a cathode rod via the first connecting wire 70 and the second connecting wire 71 respectively. A method of filling conductor materials into the third microvia hole 92 and the fourth microvia hole 94 may be done in the same manner. The conductor materials include metals or alloys, such as copper or any alloy thereof.

After that, the second layers 51b, 52b, 61b, 62b and the third layers 51c, 52c, 61c, 62c are formed in sequence on the first layer 51a of first gold finger 51, the first layer 52a of the second gold finger 52, the first layer 61a of the first patterned conductive layer 61, and the first layer 62a of the second patterned conductive layer 62. The second layers 51b, 52b, 61b, 62b are made of, for example, nickel. The third layers 51c, 52c, 61c, 62c are made of, for example, gold. Similarly, the second layers 51b, 52b, 61b, 62b and the third layers 51c, 52c, 61c, 62c are formed by electroplating. During the electroplating, the internal first tie bar 31 and second tie bar 32 serves as bridges, and the first patterned conductive layer 61 and the second patterned conductive layer 62, as conductive channels, are respectively electrically connected to a cathode rod.

Figure 4E:
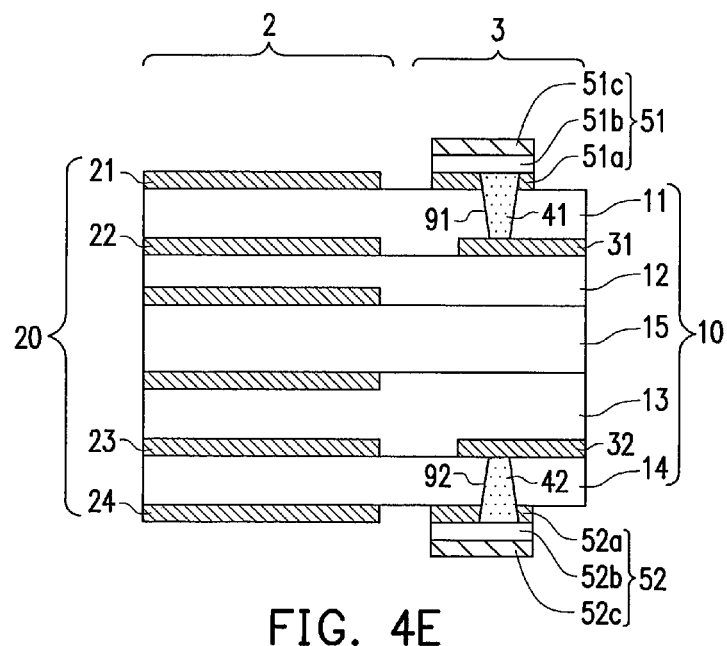

After that, referring to FIG. 4E, a board cutting process is performed to cut each layer from the first patterned conductive layer 61 to the second patterned conductive layer 62, i.e. the first patterned conductive layer 61, the second patterned conductive layer 62, and a portion of the first tie bar 31, a portion of the second tie bar 32, the second microvia 43 and the fourth microvia 44 therebetween, leaving the required circuit board.

The above embodiment illustrates a case where the first tie bar 31 is buried in the gold finger region 3 between the first dielectric layer 11 and the second dielectric layer 12, and the second tie bar 32 is buried in the gold finger region 3 between the third dielectric layer 13 and the fourth dielectric layer 14. However, positions of the first tie bar 31 and the second tie bar 32 of the present invention are not limited to the above. As long as the first tie bar 31 or the second tie bar 32 is located between any two layers of the dielectric stack, the area of the tie bar is not limited due to reduction in size of the gold finger. Moreover, since the tie bar is covered by the dielectric stack, the tie bar is not easily broken or peeled off when being inserted or removed.

In summary, a tie bar of the circuit board of the present invention is at a different level from a gold finger. The tie bar is buried in a dielectric layer and is electrically connected to the gold finger via a microvia. Therefore, area of the tie bar is not limited due to reduction in size of the gold finger. Moreover, since the tie bar is covered by a dielectric stack, after a board cutting process or during a test period, the tie bar is not easily broken or peeled off due to plugging and unplugging.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A circuit board having a tie bar buried therein, comprising:
   a dielectric stack, comprising a first dielectric layer, a second dielectric layer, a third dielectric layer, and a fourth dielectric layer, wherein the first dielectric layer is located on the second dielectric layer, the dielectric stack including a wireline region and a gold finger region;
   at least a first tie bar, buried in the gold finger region between the first dielectric layer and the second dielectric layer;
   at least a first gold finger, located only in the gold finger region on the first dielectric layer on the first tie bar;
   at least a first microvia, located in the gold finger region in the first dielectric layer and electrically connecting the first gold finger to the first tie bar;
   at least a first patterned conductive layer, located on the first dielectric layer;
   at least a second microvia, located in the first dielectric layer and electrically connecting the first patterned conductive layer to the first tie bar;
   a first connecting wire, located on the first dielectric layer and electrically connected to the first patterned conductive layer;
   at least a second tie bar, buried in the gold finger region between the third dielectric layer and the fourth dielectric layer;
   at least a second gold finger, located in the gold finger region on the fourth dielectric layer on the second tie bar;
   at least a third microvia, located in the gold finger region in the fourth dielectric layer and electrically connecting the second gold finger to the second tie bar;
   at least a second patterned conductive layer, located on the fourth dielectric layer;
   at least a fourth microvia, located in the fourth dielectric layer and electrically connecting the second patterned conductive layer to the second tie bar; and
   a second connecting wire, located on the fourth dielectric layer and electrically connected to the second patterned conductive layer.

2. The circuit board having a tie bar buried therein as claimed in claim 1, wherein a portion of the first tie bar is not covered by the first gold finger.

3. The circuit board having a tie bar buried therein as claimed in claim 1, wherein the first microvia located only in the first dielectric layer, and the first dielectric layer is a top dielectric layer.

4. The circuit board having a tie bar buried therein as claimed in claim 1, wherein the first gold finger comprises a first layer, a second layer, and a third layer.

5. The circuit board having a tie bar buried therein as claimed in claim 3, wherein the first tie bar is located on the second dielectric layer.

6. A method of fabricating a circuit board having a tie bar buried therein, comprising:
   providing a dielectric stack, the dielectric stack including a wireline region and a gold finger region, the dielectric stack comprising a first dielectric layer, a second dielectric layer, a third dielectric layer, and a fourth dielectric layer, wherein a plurality of wireline layers are formed in the wireline region of the dielectric stack;
   forming at least a first tie bar in the gold finger region between the first dielectric layer and the second dielectric layer;
   forming at least a first gold finger only in the gold finger region on the first dielectric layer, and forming at least a first microvia in the first dielectric layer, the first microvia electrically connecting the first gold finger to the first tie bar;
   forming at least a first patterned conductive layer on the first dielectric layer;
   forming at least a second microvia in the first dielectric layer, the second microvia electrically connecting the first patterned conductive layer to the first tie bar;
   forming a first connecting wire, electrically connected to the first patterned conductive layer;
   forming at least a second tie bar in the gold finger region between the third dielectric layer and the fourth dielectric layer;
   forming at least a second gold finger in the gold finger region on the fourth dielectric layer, and at least a third microvia in the gold finger region in the fourth dielectric layer, the third microvia electrically connecting the second gold finger to the second tie bar;
   forming at least a second patterned conductive layer on the fourth dielectric layer;
   forming at least a fourth microvia in the fourth dielectric layer, the fourth microvia electrically connecting the second patterned conductive layer to the second tie bar; and
   forming a second connecting wire, electrically connected to the second patterned conductive layer.

7. The method of fabricating a circuit board having a tie bar buried therein as claimed in claim 6, wherein methods of forming the first gold finger and the first microvia comprise:
   forming a first layer of the at least a first gold finger in the gold finger region on the first dielectric layer;
   forming at least a first microvia hole in the gold finger region in the first dielectric layer;
   forming the first microvia in the first microvia hole; and
   forming a second layer on the first layer of the first gold finger.

8. The method of fabricating a circuit board having a tie bar buried therein as claimed in claim 6, further comprising:
   performing a board cutting process to cut the first patterned conductive layer, and a portion of the dielectric stack and a portion of the first tie bar under the first patterned conductive layer.

9. The method of fabricating a circuit board having a tie bar buried therein as claimed in claim 6, further comprising:
   performing a board cutting process to cut the second patterned conductive layer, and a portion of the dielectric stack and a portion of the second tie bar under the second patterned conductive layer.

* * * * *